(12) United States Patent
Seol et al.

(10) Patent No.: US 9,336,887 B2
(45) Date of Patent: *May 10, 2016

(54) NONVOLATILE MEMORY DEVICE INCLUDING MEMORY CELL ARRAY WITH UPPER AND LOWER WORD LINE GROUPS

(71) Applicant: SAMSUNG ELECTRONICS CO., LTD., Suwon-Si, Gyeonggi-Do (KR)

(72) Inventors: Changkyu Seol, Hwasung (KR); Euncheol Kim, Yongin-si (KR); Junjin Kong, Yongin-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/512,965

(22) Filed: Oct. 13, 2014

(65) Prior Publication Data

US 2015/0029789 A1   Jan. 29, 2015

Related U.S. Application Data

(63) Continuation of application No. 13/413,118, filed on Mar. 6, 2012, now Pat. No. 8,861,267.

(30) Foreign Application Priority Data

Apr. 22, 2011  (KR) .................... 10-2011-0037962

(51) Int. Cl.
*G11C 16/10* (2006.01)
*G11C 16/04* (2006.01)
*G11C 16/34* (2006.01)

(Continued)

(52) U.S. Cl.
CPC ............ *G11C 16/10* (2013.01); *G11C 11/5628* (2013.01); *G11C 16/0408* (2013.01); *G11C 16/0483* (2013.01); *G11C 16/08* (2013.01);

(Continued)

(58) Field of Classification Search
CPC ........ G11C 16/10; G11C 16/26; G11C 16/08; G11C 16/0483
USPC .......................... 365/185.03, 185.11, 185.12
See application file for complete search history.

(56) References Cited

U.S. PATENT DOCUMENTS 6,735,733 B2   5/2004   La Rosa
6,850,447 B2   2/2005   Kang (Continued)

FOREIGN PATENT DOCUMENTS

JP   2007-266143   10/2007
JP   2009-146942   7/2009

(Continued)

*Primary Examiner* — Huan Hoang
*Assistant Examiner* — Tri Hoang
(74) *Attorney, Agent, or Firm* — Volentine & Whitt, PLLC

(57) ABSTRACT

A nonvolatile memory device includes a memory cell array having multiple memory blocks. Each memory block includes memory cells arranged at intersections of multiple word lines and multiple bit lines. At least one word line of the multiple word lines is included in an upper word line group and at least one other word line of the multiple word lines is included in a lower word line group. The number of data bits stored in memory cells connected to the at least one word line included in the upper word line group is different from the number of data bits stored in memory cells connected to the at least one other word line included in the lower word line group.

20 Claims, 14 Drawing Sheets

(51) Int. Cl.
*H01L 27/115* (2006.01)
*G11C 11/56* (2006.01)
*G11C 16/08* (2006.01)
*G11C 16/26* (2006.01)

(52) U.S. Cl.
CPC ............ *G11C 16/26* (2013.01); *G11C 16/3427* (2013.01); *H01L 27/11578* (2013.01)

(56) References Cited

U.S. PATENT DOCUMENTS

| | | |
|---|---|---|
| 7,468,920 B2 | 12/2008 | Sekar et al. |
| 7,791,939 B2 | 9/2010 | Kim et al. |
| 7,848,142 B2 | 12/2010 | Radke |
| 7,852,683 B2 * | 12/2010 | Lutze et al. ............... 365/185.24 |
| 7,936,004 B2 | 5/2011 | Kito et al. |
| 2010/0091575 A1 * | 4/2010 | Kim ......................... 365/185.25 |
| 2010/0097858 A1 | 4/2010 | Tokiwa et al. |

FOREIGN PATENT DOCUMENTS

| | | |
|---|---|---|
| KR | 1020040100515 A | 12/2004 |
| KR | 1020070029583 A | 3/2007 |

* cited by examiner

|  | Adjacent Select Line | BER |
|---|---|---|
| UWLG | String Select Line(SSL) | Low |
| LWLG | Ground Select Line(GSL) | High |

NONVOLATILE MEMORY DEVICE INCLUDING MEMORY CELL ARRAY WITH UPPER AND LOWER WORD LINE GROUPS

CROSS-REFERENCE TO RELATED APPLICATIONS

This is a Continuation of U.S. application Ser. No. 13/413,118, filed Mar. 6, 2012, now issued as U.S. Pat. No. 8,861,267, dated Oct. 14, 2014, the entire contents of which are herein incorporated by reference, and a claim of priority under 35 U.S.C. §119 is made to Korean Patent Application No. 10-2011-0037962, filed on Apr. 22, 2011, in the Korean Intellectual Property Office, the entire contents of which are herein incorporated by reference.

BACKGROUND

The present inventive concept herein relates to semiconductor memory devices, and more particularly, to nonvolatile memory devices.

Semiconductor memory devices are classified as volatile memory devices and nonvolatile memory devices. A volatile memory device loses its data when power is interrupted. A nonvolatile memory device maintains its stored data even when power is interrupted. Nonvolatile memory devices may include various types of memory cell transistors, and may be divided into flash memory, ferroelectric random access memory (RAM), magnetic RAM, phase change RAM, and the like, depending on the structure of memory cell transistors.

A flash memory device may be a NOR flash memory device and a NAND flash memory device, depending on the connection state of memory cells and bit lines. The structure of a NOR flash memory device includes two or more memory cell transistors connected to one bit line in parallel. Thus, a NOR flash memory device has a superior random access characteristics. The structure of a NAND flash memory device includes two or more memory cell transistors serially connected to one bit line. This structure is called a cell string structure and each cell string needs a bit line contact. Thus, NAND flash memory devices are more highly integrated.

Memory cells of a flash memory device are divided into on-cells and off-cells depending on distribution of threshold voltage. An on-cell is an erased cell and an off-cell is a programmed cell. A memory cell stores one or more bits data, depending on the type of memory cell. When a memory cell is configured to store one-bit data, the memory cell is programmed in either an erase state or a program state. When a memory cell is configured to store two-bit data, the memory cell is programmed in an erase state or one of three program states. When a memory cell is configured to store three-bit data, the memory cell is programmed in an erase state or one of seven program states.

To increase storage capacity and improve integration of flash memory devices, a flash memory device having a three dimensional structure is being studied.

SUMMARY

Embodiments of the inventive concept provide a nonvolatile memory device that includes a memory cell array divided into memory blocks. Each memory block includes multiple memory cells arranged at intersections of word lines and bit lines. At least one word line is included in an upper word line group and at least one other word line is included in a lower word line group. A number of data bits stored in memory cells connected to the at least one word line included in the upper word line group is different from a number of data bits stored in memory cells connected to the at least one other word line included in the lower word line group.

Embodiments of the inventive concept also provide a nonvolatile memory device that includes a substrate and a memory cell array including multiple cell strings. Each cell string includes at least one ground select transistor, multiple memory cells and at least one string select transistor that are stacked in a direction perpendicular to the substrate. The memory cells are located at intersections of a plurality of word lines and a plurality of bit lines. A number of data bits stored in memory cells connected to word lines in an upper word line group is different from a number of memory cells connected to word lines in a lower word line group.

Embodiments of the inventive concept also provide a nonvolatile memory device including a memory cell array and a memory controller. The memory cell array includes memory cells located at intersections of a plurality of word lines and a plurality of bit lines, where a number of data bits stored in memory cells connected to word lines in an upper word line group is different from a number of data bits stored in memory cells connected to word lines in a lower word line group. One of the upper word line group and the lower word line group includes memory cells which store a number of data bits that is not an integer. The memory controller is configured to perform multi-dimensional modulation for storing a data stream from a host in a memory cell group corresponding to the one of the upper word line group and the lower word line group including the memory cells which store the number of data bits that is not an integer. A number of logic states of each of the memory cells in the memory cell group is two raised to the power of the number of data bits stored therein, and a total number of logic states of the memory cell group is the number of logic states of each of the memory cells raised to the power of the number of memory cells in the memory cell group.

BRIEF DESCRIPTION OF THE FIGURES

Illustrative embodiments will be more clearly understood from the following detailed description taken in conjunction with the accompanying drawings.

DETAILED DESCRIPTION OF THE EMBODIMENTS

Figure 1:
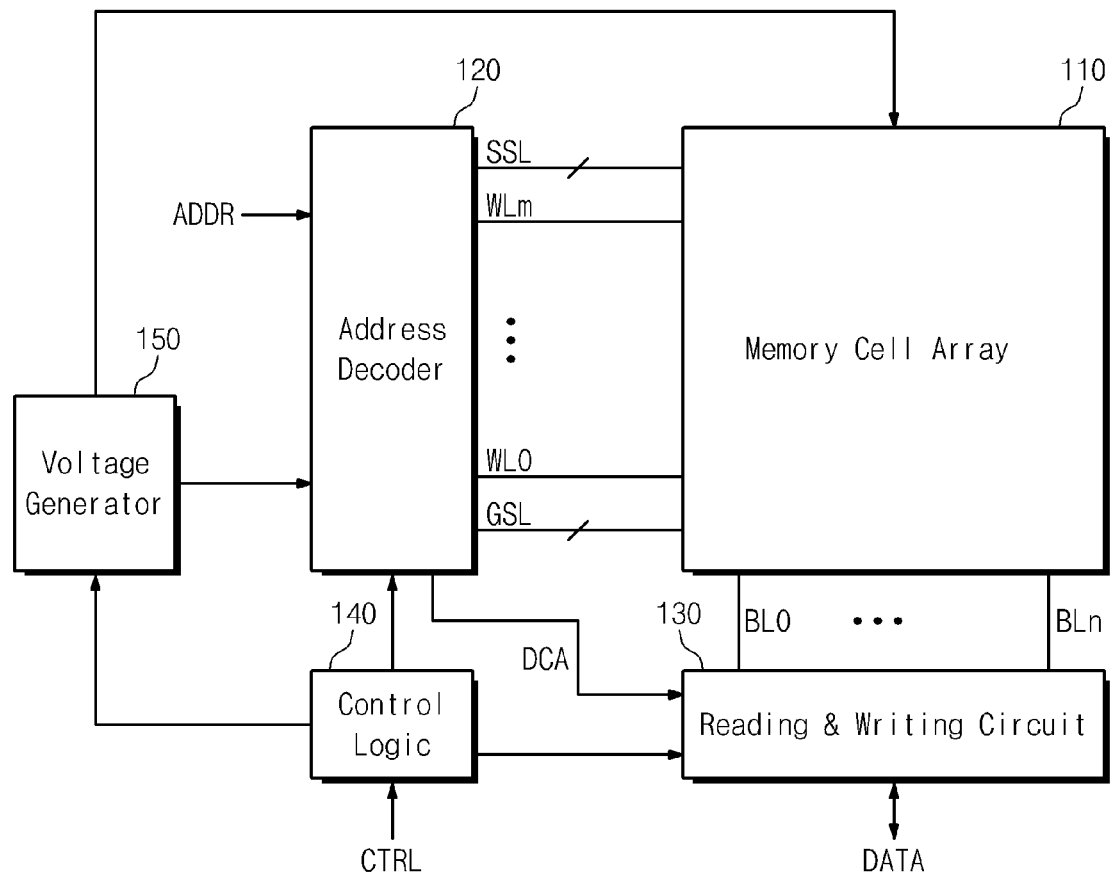
FIG. 1 is a block diagram illustrating a nonvolatile memory device, according to embodiments of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

The terminology used herein is for the purpose of describing particular embodiments only and is not intended to be limiting of the invention. It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Also, "exemplary" is intended to refer to an example or illustration.

FIG. 1 is a block diagram illustrating a nonvolatile memory device 100, according to embodiments of the inventive concept. Referring to FIG. 1, the nonvolatile memory device 100 includes a memory cell array 110, an address decoder 120, a reading and writing circuit 130, a control logic 140 and a voltage generator 150.

The memory cell array 110 includes multiple cell strings arranged in row and column directions on a substrate. Each of the cell strings includes a multiple memory cells stacked along a direction perpendicular to the substrate. That is, the memory cells are provided along a row and a column and stacked along a direction perpendicular to the substrate to form a three dimensional structure.

The memory cells of the memory cell array 110 can store one or more bits in one cell. For example, one-bit data may be stored in each memory cell, in which case each memory cell is called a single level cell (SLC). Two or more bit data may be stored in each memory cell, in which case each memory cell is called a multi-level cell (MLC).

The address decoder 120 is connected to the memory cell array 110 through word lines WL0-WLm, string select line SSL and ground select lines GSL. The address decoder 120 operates under control of the control logic 140. The address decoder 120 may include a row decoder (not shown) for decoding a row address, a column decoder (not shown) for decoding a column address and an address buffer (not shown) storing the received address ADDR.

The address decoder 120 is configured to receive externally provided addresses ADDR and to decode a row address of the received addresses ADDR. The address decoder 120 selects a word line corresponding to the decoded row address of word lines WL0-WLm. The address decoder 120 also selects a string select line and a ground select line corresponding to the decoded row address of the string select lines SSL and the ground select lines GSL. The address decoder 120 is further configured to decode a column address of the received addresses ADDR. The address decoder 120 transfers the decoded column address DCA to the reading and writing circuit 130.

The reading and writing circuit 130 is connected to the memory cell array 110 through bit lines BL0-BLn. The reading and writing circuit 130 is configured to exchange data DATA with the external devices. The reading and writing circuit 130 receives a decoded column address DCA from the address decoder 120. In response to the decoded column address DCA, the reading and writing circuit 130 selects bit lines BL0-BLn. The reading and writing circuit 130 receives data DATA from the external devices and writes the received data DATA in the memory cell array 110. The reading and writing circuit 130 also reads data DATA from the memory cell array 110 and outputs the read data DATA to the external devices.

The reading and writing circuit 130 may include constituent elements, such as a page buffer or page register (not shown), a column select circuit (not shown) and a data buffer (not shown). The reading and writing circuit 130 may include further constituent elements such as a sense amplifier (not shown), a writing driver (not shown), a column select circuit (not shown) and a data buffer (not shown).

The control logic 140 is connected to the address decoder 120, the reading and writing circuit 130, and the voltage generator 150. The control logic 140 is configured to control the entire operation of the nonvolatile memory device 100. The control logic 140 operates in response to an externally provided control signal CTRL. The control signal CTRL may include a command CMD, for example.

The voltage generator 150 operates under control of the control logic 140. The voltage generator 150 is configured to generate various voltages used in the nonvolatile memory device 100, including high voltages used in the nonvolatile memory device 100. Voltages generated by the voltage generator 150 may be provided to the address decoder 120 and the memory cell array 110.

According to various embodiments, the number of data bits stored in the memory cells may differ depending on the location of the word lines WL0-WLm to which the memory cells are connected and/or the bit error rate of the memory cells connected to the word lines WL0-WLm. For example, when n bit data are stored in memory cells of a lower word line group adjacent to the ground select line GSL, data exceeding n bits may be stored in memory cells of an upper word line group adjacent to the string select line SSL. Likewise, when n bit data are stored in memory cells of the upper word line group adjacent to the string select line SSL, data exceeding n bits may be stored in memory cells of the lower word line group adjacent to the ground select line GSL. According to various embodiments, since the number of data bits being stored in the memory cells may vary, data storage capacity of the nonvolatile memory device 100 improves.

Figure 2:
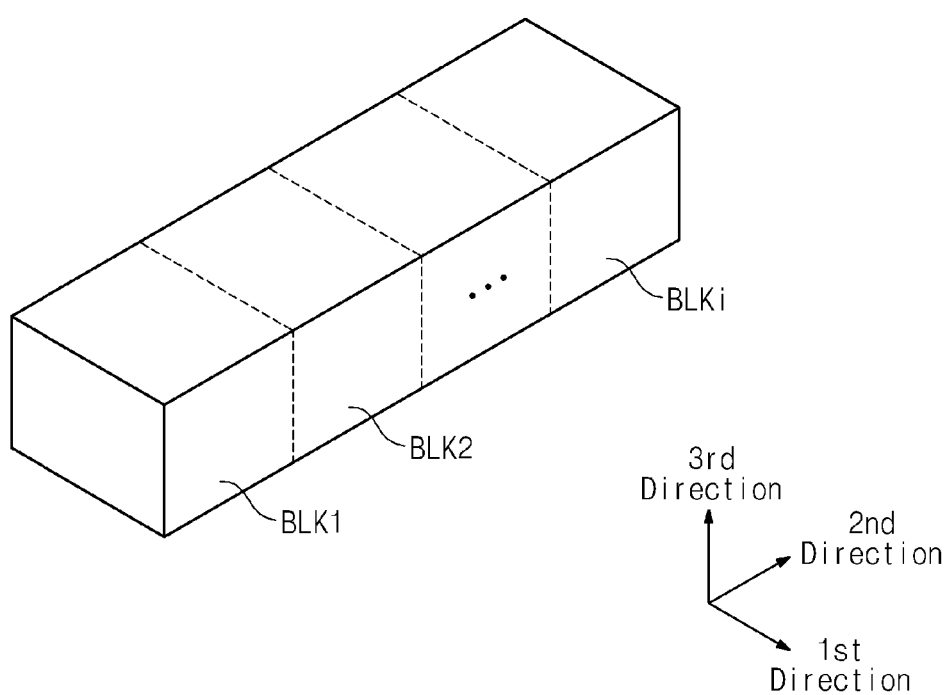
FIG. 2 is a block diagram illustrating a memory cell array of FIG. 1, according to an embodiment of the inventive concept.

FIG. 2 is a block diagram illustrating the memory cell array 110 of FIG. 1, according to an exemplary embodiment. Referring to FIGS. 1 and 2, the memory cell array 110 includes memory blocks BLK1-BLKi. Each memory block BLK has a three dimensional structure (or vertical structure), in which structures extend in first through third directions, respectively. For example, each memory block BLK may include multiple cell strings (not shown) that extend in the second direction, where the cell strings are spaced apart from one another in the first and third directions.

The cell strings (not shown) of one memory block are connected to multiple lines BL, multiple string select lines SSL, multiple word lines WL, one or more ground select lines GSL and a common source line (not shown). The cell strings (not shown) of the multiple memory blocks BLK1-BLKi may share bit lines BL. For instance, the bit lines BL may extend in the second direction to be shared by the memory blocks BLK1-BLKi. Generally, each of the memory blocks BLK1-BLKi includes memory cells arranged at intersections of the word lines WL and the bit lines BL.

The memory blocks BLK1-BLKi are selected by the address decoder 120. The address decoder 120 is configured to select a memory block corresponding to the received address ADDR of the memory blocks BLK1-BLKi. A program operation, a reading operation and an erasure operation may be performed in the selected memory block. The memory blocks BLK1-BLKi will be described in more detail with respect to FIGS. 3 through 6, below.

Figure 3:
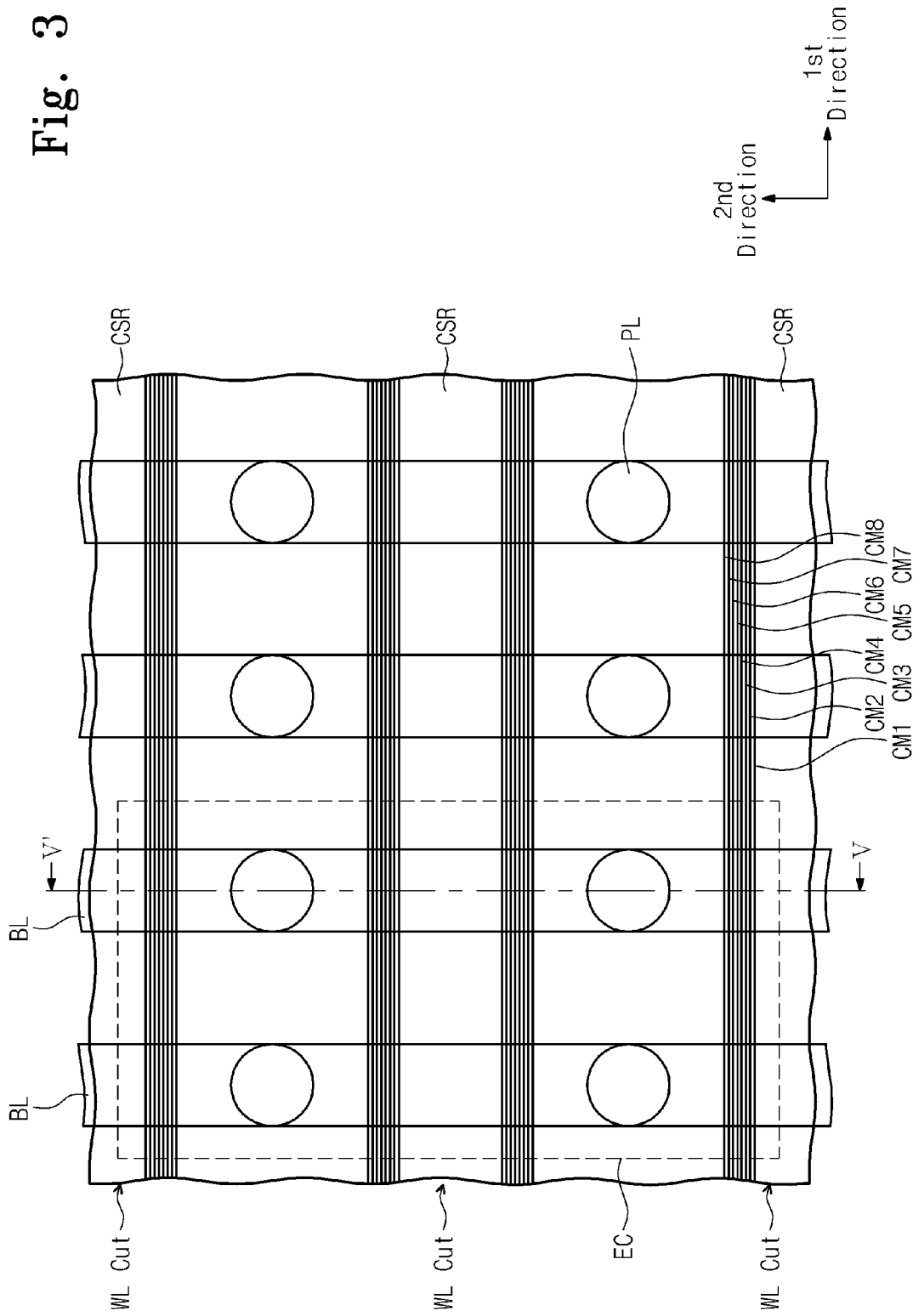
FIG. 3 is a top plan view illustrating part of one memory block among memory blocks of FIG. 2, according to an embodiment of the inventive concept.
Figure 4:
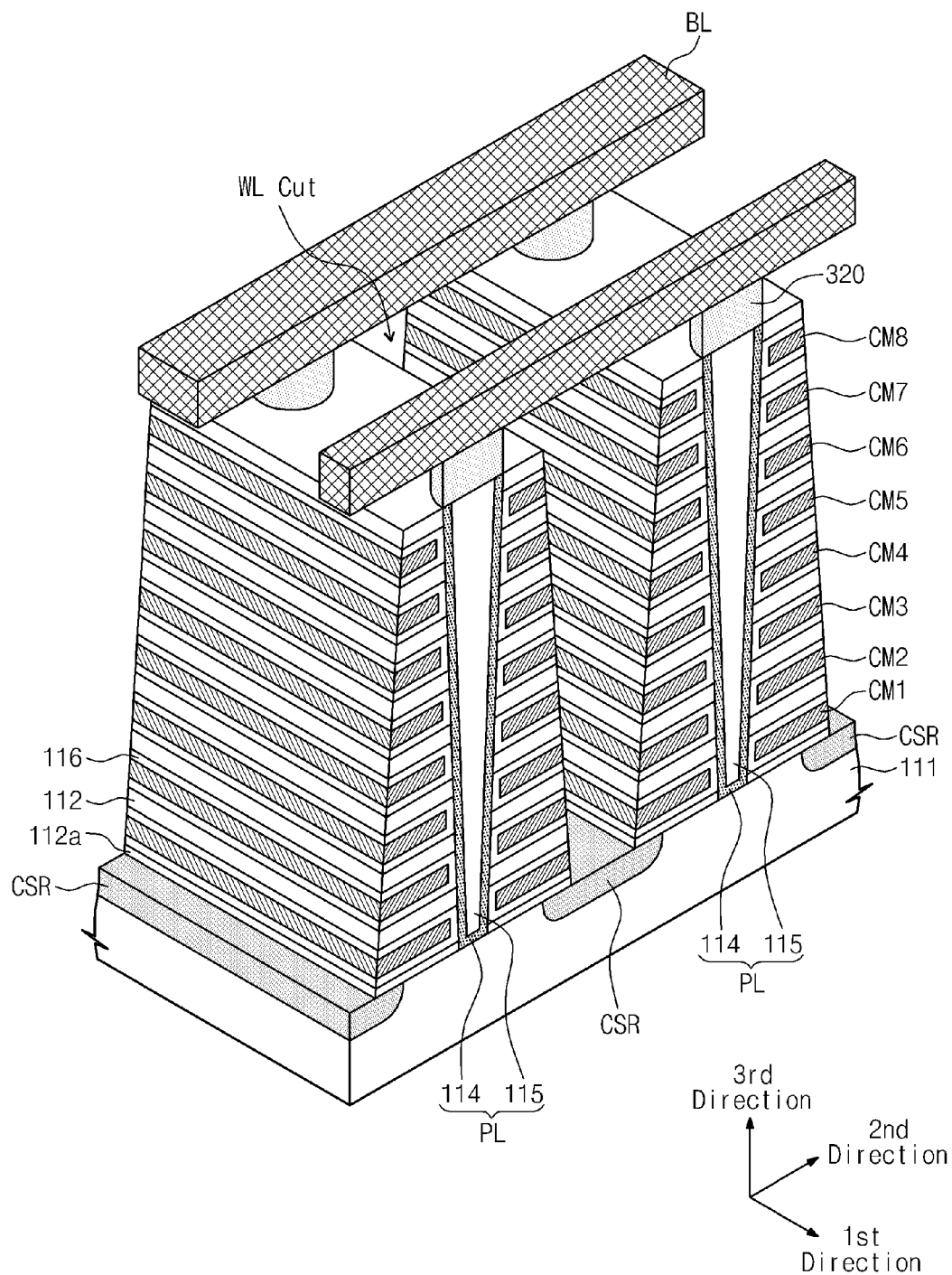
FIG. 4 is a perspective cross-sectional view illustrating a perspective cross section taken along the line V-V' of FIG. 3, according to an embodiment of the inventive concept.
Figure 5:
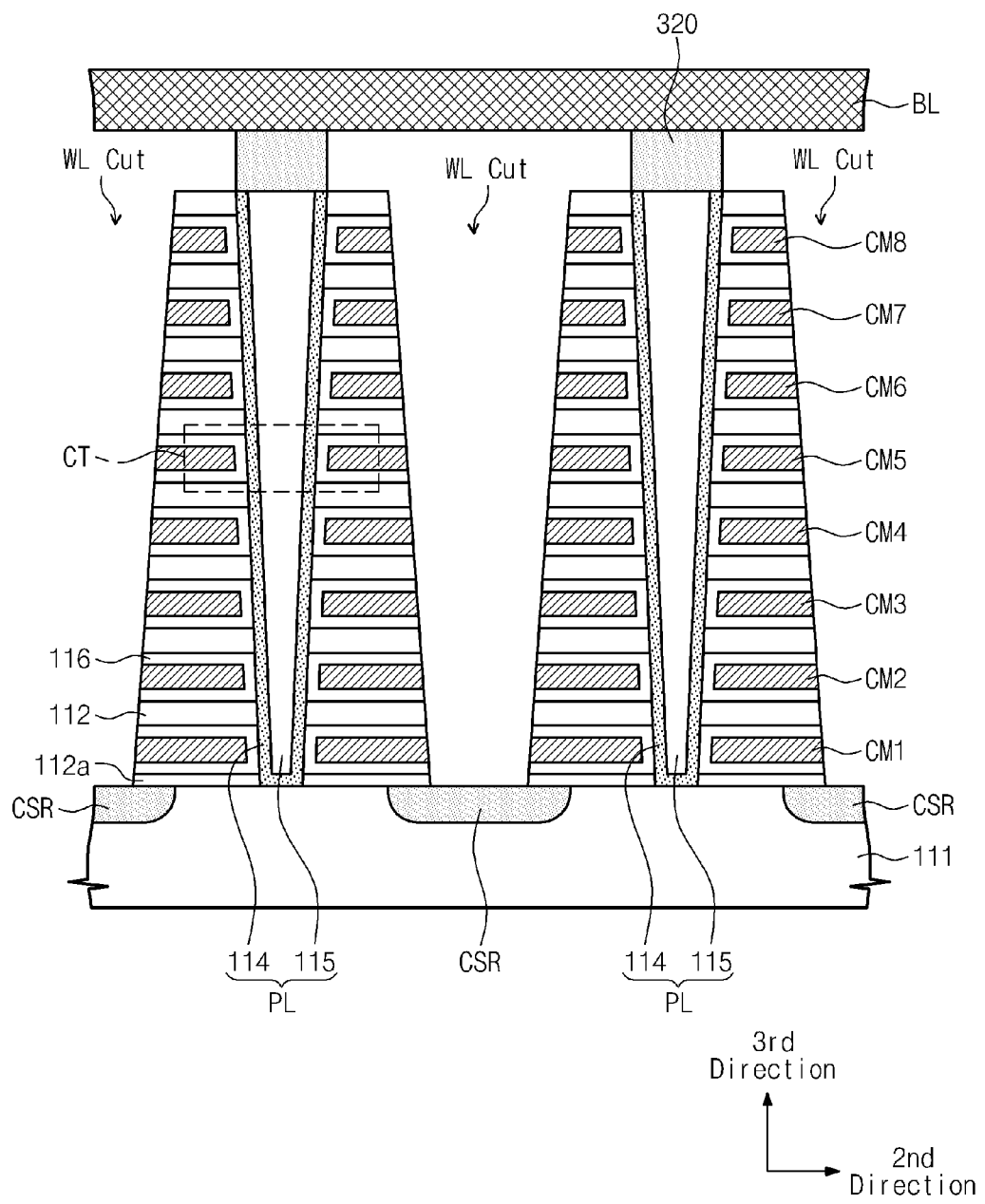
FIG. 5 is a cross-sectional view taken along the line V-V' of FIG. 3, according to an embodiment of the inventive concept.

FIG. 3 is a top plan view illustrating a part of a representative memory block BLKi of the memory blocks BLK1-BLKi of FIG. 2, according to an exemplary embodiment. FIG. 4 is a perspective cross-sectional view illustrating a perspective cross-section taken along the line V-V' of FIG. 3, and FIG. 5 is a cross-sectional view taken along the line V-V' of FIG. 3, according to an exemplary embodiment. FIGS. 3 through 5, depict three-dimensional structures extending along first through third directions.

Referring to FIGS. 3 through 5, a substrate 111 may be a well having a first conductivity type. For example, the substrate 111 may be a P-well in which a third group element, such as boron B, is implanted. The substrate 111 may be a pocket P-well provided in an N-well. For purposes of explanation, it may be assumed that the substrate 111 is a P-well (or a pocket P-well), although it is understood that the substrate 111 is not limited to P conductivity type in various embodiments.

Common source regions CSR are formed on the substrate 111, extending in the first direction and spaced apart from one another in the second direction. The common source regions CSR are connected to one another in common to form a common source line.

The common source regions CSR have a second conductivity type different from the substrate 111. For example, the common source regions CSR may have an N conductivity type when the substrate 111 has a P conductivity type. For purposes of explanation, it may be assumed that the common source regions CSR have an N conductivity type, although it is understood that the common source regions CSR are not limited to N conductivity type in various embodiments.

Insulating materials 112 and 112a are sequentially provided on the substrate 111 in the third direction (i.e., a direction perpendicular to the substrate 111) between two adjacent common source regions CSR. The insulating materials 112 and 112a may be spaced apart from one another in the third direction, and extend in the first direction. The insulating materials 112 and 112a are formed of an insulating material, such as a semiconductor oxide layer. The thickness of the insulating material 112a contacting the substrate 111 may be smaller than thicknesses of other insulating materials 112.

Pillars PL are sequentially disposed in the first direction, penetrating the insulating materials 112 and 112a in the second direction, between adjacent common source regions CSR. Each of the pillars PL penetrates the insulating materials 112 and 112a to contact the substrate 111. The pillars PL may be spaced apart from one another in the first direction between the corresponding adjacent common source regions CSR. The pillars PL may be disposed in a row in the first direction. The pillars PL may be formed of one or more materials, and may include channel layers 114 and internal materials 115 formed within the channel layers 114.

The channel layers 114 may be formed of a semiconductor material (e.g., silicon) having a first conductivity type. The semiconductor material (e.g., silicon) of the channel layers 114 may be the same conductivity type as the substrate 111. The channel layers 114 may include intrinsic semiconductor not having a conductivity type. The internal materials 115 may be formed of an insulating material, such as silicon oxide, for example. The internal materials 115 may include an air gap.

Between adjacent common source regions CSR, data storage layers 116 are provided on exposed surfaces of the insulating materials 112 and 112a and the pillars PL. The data storage layers 116 are configured to store data by capturing or releasing charges.

Conductive materials CM1-CM8 are provided on exposed surfaces of the data storage layers 116 between adjacent common source regions CSR and between the insulating materials 112 and 112a. The conductive materials CM1-CM8 may extend in the first direction. The conductive materials CM1-CM8 may be divided by word line cuts WL cut on the common source regions CSR. The word line cuts WL cut expose the common source regions CSR. The word line cuts WL cut may extend along the common source regions CSR in the first direction. The conductive materials CM1-CM8 may include a metallic conductive material or a nonmetallic conductive material, such as polysilicon, for example.

The data storage layers 116 provided on a top surface of the uppermost insulating material among the insulating materials 112 and 112a may be removed. The data storage layers 116 provided on a side facing the pillars PL among sides of the insulating materials 112 and 112a may be removed.

Drains 320 are respectively provided on the pillars PL. The drains 320 may include a semiconductor material (e.g., silicon) having a second conductivity type. For instance, the drains 320 may include a semiconductor material (e.g., silicon) having an N conductivity type. For purposes of explanation, it may be assumed that the drains 320 include N-type silicon, although it is understood that the drains 320 are not limited to N-type silicon in various embodiments. The drains 320 may extend on top surfaces of the channel layers 114 of the pillars PL.

Bit lines BL extending in the second direction and spaced apart from one another in the first direction are provided on the drains 320, and are connected to the drains 320. The drains 320 and the bit lines BL may be connected to each other through contact plugs (not shown). The bit lines BL may include metallic conductive materials or nonmetallic conductive materials, such as polysilicon, for example.

The conductive materials CM1-CM8 have first through eighth distances sequentially from the substrate 111, respectively. The pillars PL form cell strings together with the data storage layers 116 and the conductive materials CM1-CM8. Each of the pillars PL constitutes one cell string together with the data storage layers 116 and the adjacent conductive materials CM1-CM8.

The pillars PL are provided on the substrate 111 in a row direction and a column direction. The eighth conductive materials CM8 may constitute rows. That is, the pillars PL connected to the same conductive material among the eighth conductive materials CM8 may constitute one row. The bit lines BL may constitute columns. The pillars PL connected to a same bit line among the bit lines BL may constitute one column. The pillars PL constitute cell strings disposed along a row direction and a column direction together with the data storage layers 116 and the conductive materials CM1-CM8. Each of the cell strings includes multiple cell transistors CT stacked in a direction perpendicular to the substrate 111.

Figures 6, 7:
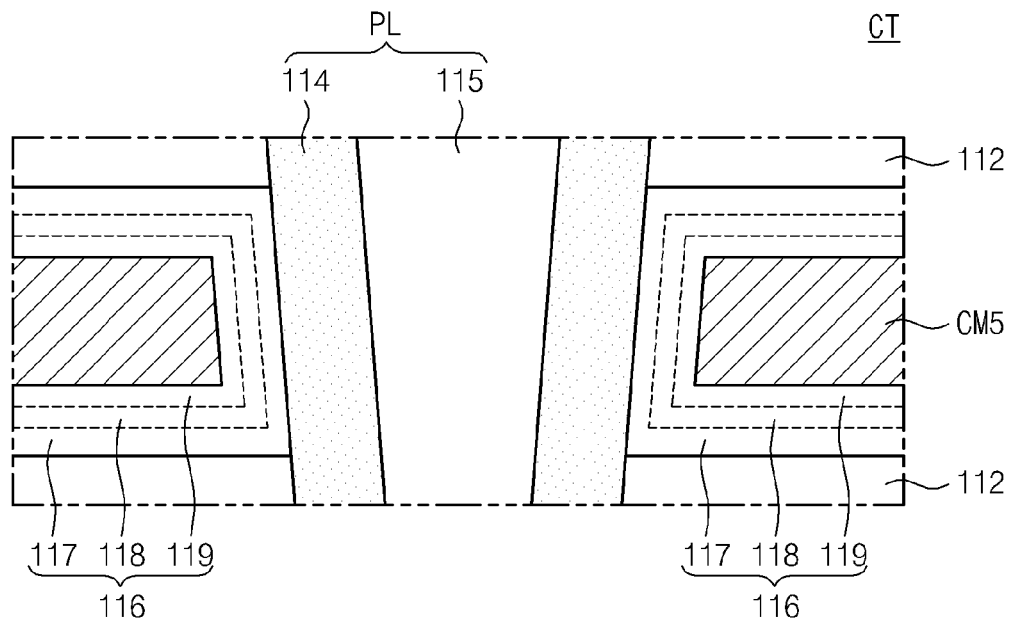
FIG. 6 is an enlarged view illustrating one of cell transistors of FIG. 5.
FIG. 7 is a table comparing an upper word line group and a lower word line group, according to embodiments of the inventive concept.

FIG. 6 is an enlarged view illustrating a representative cell transistor CT of the cell transistors of FIG. 5, according to an exemplary embodiment. Referring to FIGS. 3 through 6, the cell transistors CT are comprised of the conductive materials CM1-CM8, the pillars PL and the data storage layers 116 provided between the conductive materials CM1-CM8 and the pillars PL.

The data storage layers 116 extend from between the conductive materials CM1-CM8 and the pillars PL to top surfaces and bottom surfaces of the conductive materials CM1-CM8. In the depicted embodiment, the data storage layers 116 include first through third sub-insulating layers 117, 118 and 119.

In the cell transistors CT, the channel layers 114 of the pillars PL may include P-type silicon, for example, having the same conductivity type as the substrate 111. The channel layers 114 operate as a body of the cell transistors CT. The channel layers 114 are formed in a direction perpendicular to the substrate 111. That is, the channel layers 114 may operate as a vertical body. Vertical channels may be formed on the channel layers 114.

The first sub-insulating layers 117 adjacent to the pillars PL operate as tunneling insulating layers of the cell transistors CT. The first sub-insulating layers 117 may include a thermal oxide layer or a silicon oxide layer, for example. The second sub-insulating layers 118, between the first sub-insulating layers 117 and the third sub-insulating layers 119, operate as charge storage layers and/or charge capturing layers of the cell transistors CT. The second sub-insulating layers 118 may include a nitride layer or a metallic oxide layer, for example. The third sub-insulating layers 119 adjacent to the conductive materials CM1-CM8 may operate as blocking insulating layers of the cell transistors CT. Each of the third sub-insulating layers 119 may be formed as a single layer or a multiple layer. The third sub-insulating layers 119 may be a high dielectric layer (e.g., an aluminum oxide layer, a hafnium oxide layer or the like) having a dielectric constant higher than the first and second sub-insulating layers 117 and 118, for example. The third sub-insulating layers 119 may include a silicon oxide layer, for example. Collectively, the first through third sub-insulating layers 117, 118 and 119 may constitute ONA (oxide-nitride-aluminum oxide) or ONO (oxide-nitride-oxide), for example.

The conductive materials CM1-CM8 operate as gates (or control gates) of the cell transistors CT. That is, in an embodiment, the conductive materials CM1-CM8 operate as gates (or control gates), the third sub-insulating layers 119 operate as blocking insulating layers, the second sub-insulating layers 118 operate as charge storage layers, the first sub-insulating layers 117 operate as tunneling insulating layers and the channel layers 114 operating as a vertical body constitute cell transistors CT stacked in a direction perpendicular to the substrate 111. The cell transistors CT may be charge capturing type cell transistors, for example.

The cell transistors CT may serve different purposes according to their respective distances from the substrate 111. The cell transistors CT having at least one distance from the substrate 111, e.g., provided in an upper portion of the cell transistors CT, may be used as string select transistors. The string select transistors perform switching between the cell strings and the bit lines. The cell transistors CT having at least one distance from the substrate 111, e.g., provided in a lower portion of the cell transistors CT, may be used as ground select transistors. The ground select transistors perform switching between the cell strings and the common source lines comprised of common source regions CSR. The cell transistors CT between the string select transistors and the ground select transistors may be used as memory cells and dummy memory cells.

The conductive materials CM1-CM8 extend in the first direction to combine with the pillars PL. The conductive materials CM1-CM8 may constitute conductive lines connecting cell transistors CT of the pillars PL to one another. The conductive materials CM1-CM8 may be used as a string select line SSL, a ground select line GSL, a word line WL or a dummy word line DWL, according their respective distances from the substrate 111.

Conductive materials CM1-CM8 connecting cell transistors CT used as the string select transistors SST to one another may be string select lines SSL. Conductive materials CM1-CM8 connecting cell transistors CT used as the ground select transistors GST to one another may be ground select lines GSL. Conductive materials CM1-CM8 connecting cell transistors CT used as the memory cells to one another may be word lines WL. Conductive materials CM1-CM8 connecting cell transistors CT used as the dummy memory cells to one another may be dummy word lines.

In the embodiment depicted in FIG. 5, each pillar PL is tapered, in that the width of the lower portion of each pillar PL is smaller than the width of the upper portion of the pillar PL, due to the nature of the process. The strength of the electric field applied by the same gate voltage may be different in memory cells formed in pillar PL regions having smaller widths (i.e., the lower region of the pillar PL) and memory cells formed in pillar PL regions having larger widths (i.e., an upper region of the pillar PL). As a result, a distribution of threshold voltages of the memory cells formed in the lower region of the pillar PL may be greater than a distribution of threshold voltages of the memory cells formed in the upper region of the pillar PL. Thus, a bit error rate of the memory cells formed in the lower region of the pillar PL may be higher than a bit error rate of the memory cells formed in the upper region of the pillar PL. In other words, bit error rates may increase going from an upper word line of conductive material CM8 to a lower word line of conductive material CM1.

FIG. 7 is a table comparing an upper word line group and a lower word line group, in accordance with embodiments of the inventive concept.

Referring to FIGS. 1 and 7, word lines WL0-WLm are divided into an upper word line group UWLG and a lower word line group LWLG. The upper word line group UWLG and the lower word line group LWLG may be determined depending on which select line, i.e., the string select line SSL or the ground select line GSL, the word lines are adjacent or closest to. The upper word line group UWLG and the lower word line group LWLG may be determined depending on bit error rates of the memory cells connected to each word line group. In this case, the number of word lines in the upper word line group UWLG and the lower word line group LWLG may vary depending on the bit error rates.

The upper word line group UWLG includes word lines adjacent and/or close to the string select line SSL. The bit error rates of the memory cells connected to the upper word line group UWLG are lower than the bit error rates of the memory cells connected to the lower word line group LWLG. That is, the upper word line group UWLG includes word lines to which memory cells having low bit error rates are connected.

The lower word line group LWLG includes word lines adjacent and/or close to the ground select line GSL. The bit error rates of the memory cells connected to the lower word line group LWLG are higher than the bit error rates of the memory cells connected to the upper word line group UWLG. That is, the lower word line group LWLG includes word lines to which memory cells having high bit error rates are connected.

Figure 8:
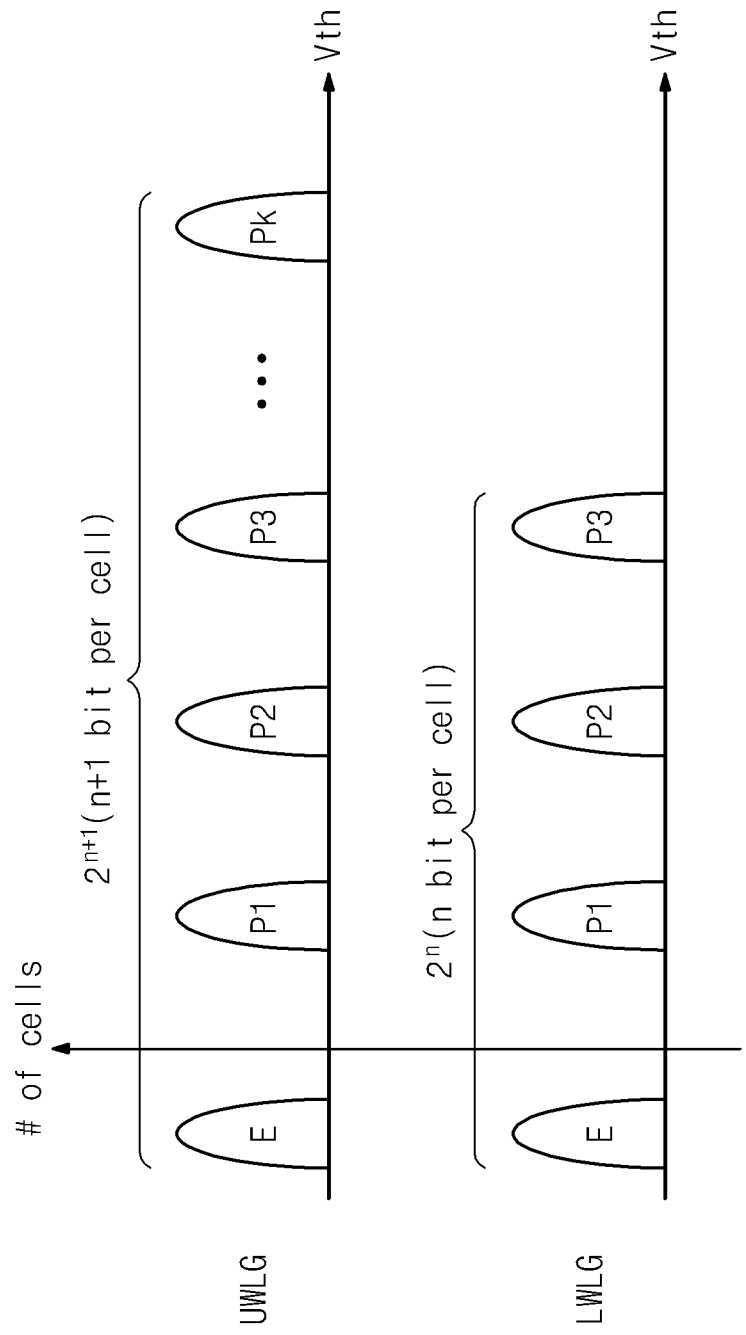
FIG. 8 is a view illustrating distributions of threshold voltages of memory cells of an upper word line group and a lower word line group, according to embodiments of the inventive concept.

FIG. 8 is a view illustrating distribution of threshold voltages of memory cells of an upper word line group and a lower word line group, according to embodiments of the inventive concept. In the example shown in FIG. 8, two-bit data per cell are stored in each memory cell of the lower word line group LWLG. However, the number of bits of data stored in each memory cell of the lower word line group LWLG is not limited thereto. That is, at least one-bit data per cell may be stored in memory cells of the lower word line group LWLG.

According to various embodiments, memory cells of the upper word line group UWLG store data having more than the number of bits stored by memory cells of the lower word line group LWLG. That is, when n bit data (n being an integer greater than or equal to one) per cell is stored in the memory cells of the lower word line group LWLG, more than n bit data per cell is stored in the memory cells of the upper word line group UWLG. For instance, when n bit data per cell is stored in the memory cells of the lower word line group LWLG, n+1 bit data per cell may be stored in the memory cells of the upper word line group UWLG.

In the embodiment depicted in FIG. 8, two-bit data per cell (n=2) is stored in the memory cells of the lower word line group LWLG. In this case, each of the memory cells of the lower word line group LWLG has a threshold voltage corresponding to one of four logic states ($2^n$), logic states E, P1, P2 and P3. The logic state E is an erase state and the logic states P1, P2 and P3 are program states. When two-bit data per cell is stored in the memory cells of the lower word line group LWLG, three-bit data per cell (n+1=3) may be stored in the memory cells of the upper word line group UWLG. In this case, each of the memory cells of the upper word line group UWLG has a threshold voltage corresponding to one of eight logic states ($2^{n+1}$), logic states E and P1 to P7. The logic state E is an erase state and the logic states P1 to P7 are program states.

When the difference between bit error rates of the memory cells of the upper word line group UWLG and the memory cells of the lower word line group LWLG is not large enough, the number of logic states of the memory cells of the upper word line group UWLG is not increased to $2^{n+1}$. Each of the memory cells of the lower word line group LWLG has a threshold voltage corresponding to one of the four logic states, and each of the memory cells of the upper word line group UWLG has a threshold voltage corresponding to one of five logic states. In this case, 2.25-bit data per cell is stored in the memory cells of the upper word line group UWLG. Thus, the memory cells of the upper word line group UWLG are accessed through a multi-dimensional modulation scheme. The multi-dimensional modulation scheme is described in detail with reference to FIGS. 10 and 11, below.

Figure 9:
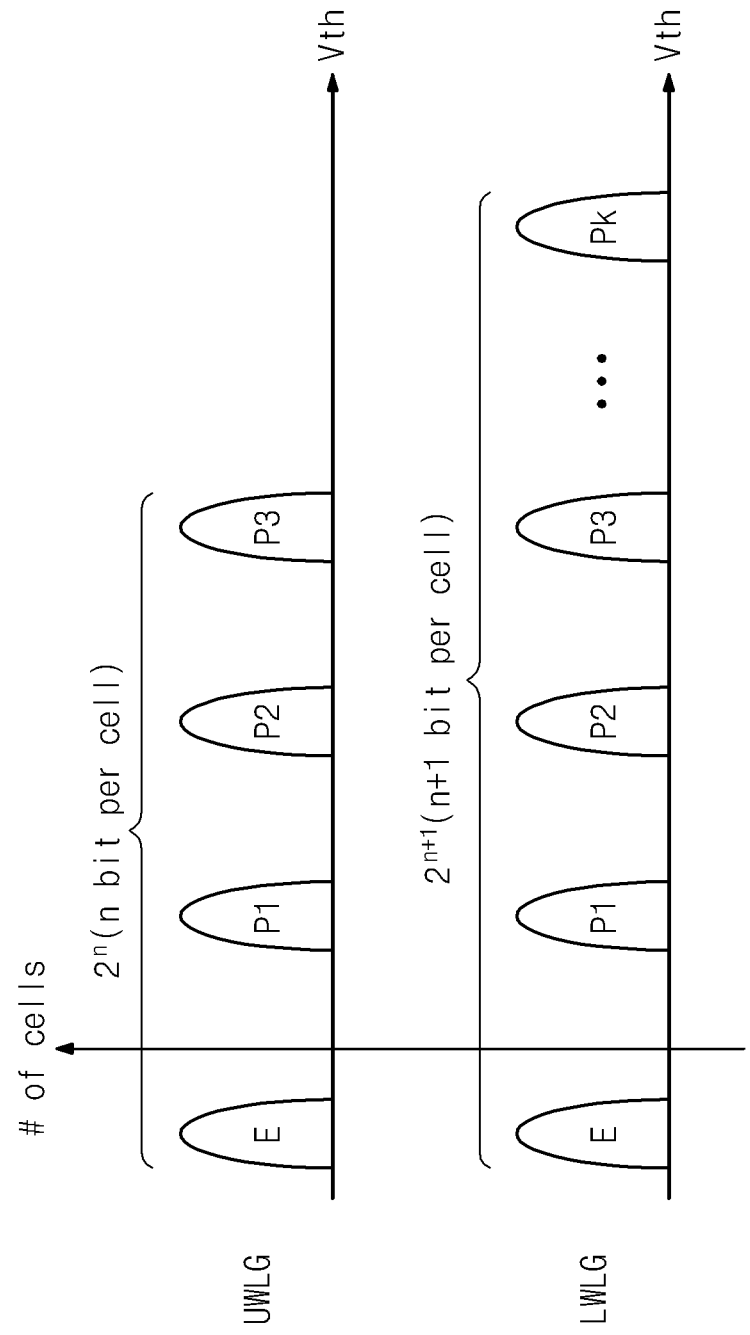
FIG. 9 is a view illustrating other distributions of threshold voltages of memory cells of an upper word line group and a lower word line group, according to embodiments of the inventive concept.

FIG. 9 is a view illustrating another distribution of threshold voltages of memory cells of an upper word line group and a lower word line group, according embodiments of the inventive concept. In the example shown in FIG. 9, two-bit data per cell is stored in memory cells of the upper word line group UWLG. However, the number of bits stored in memory cells of the upper word line group UWLG is not limited thereto. That is, at least one-bit data per cell may be stored in the memory cells of the upper word line group UWLG.

According to various embodiments, memory cells of the lower word line group LWLG may store data having more than the number of bits stored by memory cells of the upper word line group UWLG. That is, when n bit data (n being an integer of 1 or more) per cell is stored in the memory cells of the upper word line group UWLG, n+1 bit data per cell may be stored in the memory cells of the lower word line group LWLG.

In the embodiment depicted in FIG. 9, two-bit data per cell (n=2) are stored in the memory cells of the upper word line group UWLG. In this case, each of the memory cells of the upper word line group UWLG has a threshold voltage corresponding to one of four logic states ($2^n$), logic states E, P1, P2 and P3. The logic state E is an erase state and the logic states P1, P2 and P3 are program states. When two-bit data per cell are stored in the memory cells of the upper word line group UWLG, three-bit data per cell (n+1=3) may be stored in the memory cells of the lower word line group LWLG. In this case, each of the memory cells of the lower word line group LWLG has a threshold voltage corresponding to one of eight logic states ($2^{n+1}$), logic states E and P1 to P7. The logic state E is an erase state and the logic states P1 to P7 are program states.

When the difference between bit error rates of the memory cells of the upper word line group UWLG and the memory cells of the lower word line group LWLG is not sufficiently great, the number of logic states of the memory cells of the lower word line group LWLG is not increased to $2^{n+1}$. Each of the memory cells of the upper word line group UWLG has a threshold voltage corresponding to one of the four logic states, and each of the memory cells of the lower word line group LWLG has a threshold voltage corresponding to one of five logic states. In this case, 2.25-bit data per cell is stored in the memory cells of the lower word line group LWLG. Thus, the memory cells of the lower word line group LWLG are accessed through a multi-dimensional modulation scheme. The multi-dimensional modulation scheme is described in detail with reference to FIGS. 10 and 11, below.

According to other embodiments, the number of data bits stored in the memory cells of the lower word line group LWLG having a high bit error rate increases. An increased storage capacity of the memory cells of the lower word line group LWLG may be used to store parity data for lowering the bit error rate. A bit error rate of the lower word line group LWLG may be lowered through a coded modulation scheme, for example. The coded modulation scheme is described in detail with reference to FIG. 12, below.

Figure 10:
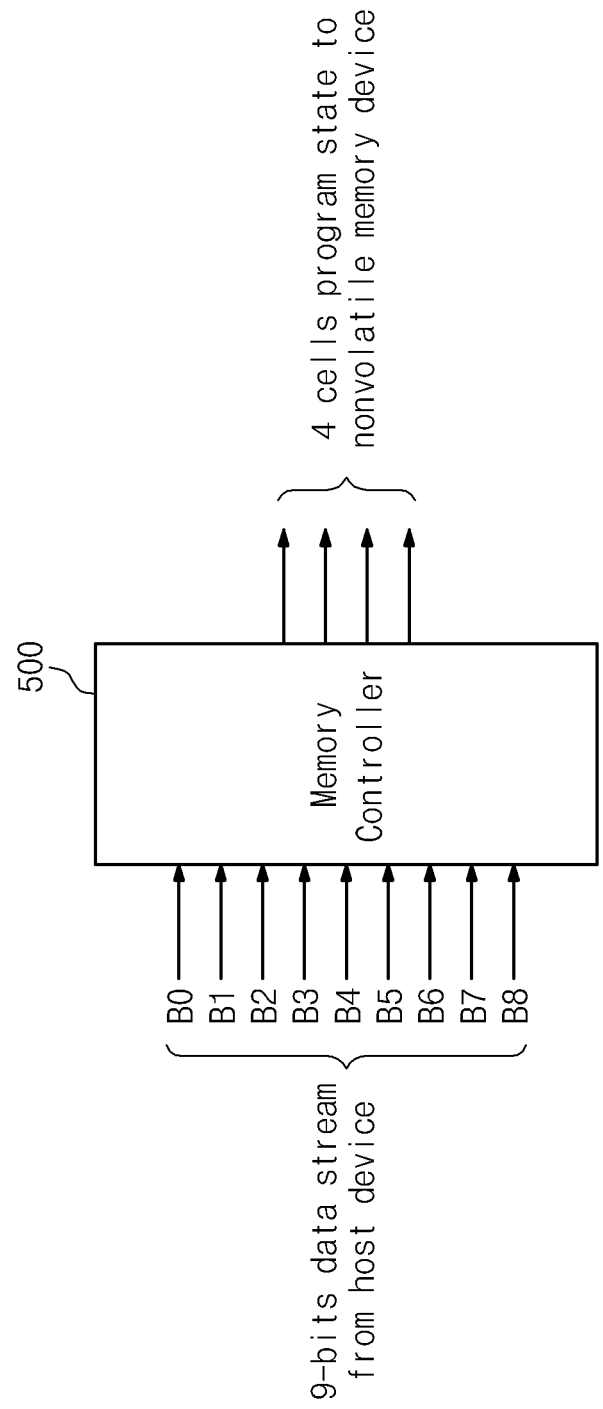
FIG. 10 is a block diagram illustrating a memory controller configured to perform a multi-dimensional modulation method, according to embodiments of the inventive concept.
Figure 11:
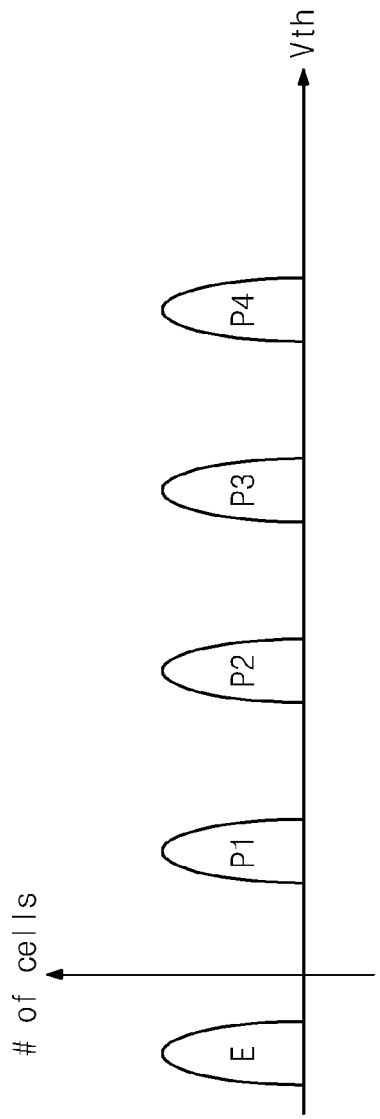
FIG. 11 is a view for illustrating a multi-dimensional modulation method, according to an embodiment of the inventive concept.

FIG. 10 is a block diagram illustrating a memory controller configured to perform a multi-dimensional modulation method, according to embodiments of the inventive concept. FIG. 11 is a view illustrating a multi-dimensional modulation method, according to embodiments of the inventive concept. According to various embodiments, when the difference between bit error rates of memory cells of the upper word line group UWLG and memory cells of the lower word line group LWLG is not sufficiently large, the number of logic states of the memory cells of the upper word line group UWLG or the memory cells of the lower word line group LWLG is not increased by a power of two. In this case, the memory cells of the upper word line group UWLG or the memory cells of the lower word line group LWLG are accessed through a multi-dimensional modulation scheme.

For a purposes of explanation, it may be assumed that the number of logic states of the memory cells of the upper word line group UWLG (or the lower word line group LWLG) is five (i.e., the number of logic states is two raised to the power of the number of data bits per cell, such as $2^{2.25}$). According to the multi-dimensional modulation scheme, four memory cells are grouped to one unit, referred to as one memory cell group. As assumed above, since each of the four memory cells is programmable to have five logic states, the memory cell group may have 625 (i.e., $5^4$) logic states, which is the number of logic states for each memory cell raised to the power of the number of memory cells in the memory cell group. When 512 logic states are selected among the 625 logic states of one memory cell group for mapping nine-bit data, one memory cell group is able to store nine-bit data.

Referring to the example shown in FIGS. 10 and 11, a memory controller 500 performs mapping of a nine-bit data stream (B0 to B8) provided from a host to be stored in one memory cell group comprised of four memory cells C1-C4. For example, the memory controller 500 programs all the memory cells C1-C4 to the logic state E to store nine-bit data stream "000000000" in the four memory cells C1-C4; the memory controller 500 programs the memory cells C1-C3 to the logic E and the memory cell C4 to the logic state P1 to store nine-bit data stream "000000001" in the four memory cells C1-C4; and so on.

According to various embodiments, even though the number of data bits that can be stored in the memory cells of the upper word line group UWLG (or the lower word line group LWLG) is not an integer (i.e., the number of logic states of the memory cells is not increased by a power factor of two), additional data bits may be stored through the multi-dimensional modulation scheme of the memory controller 500.

Figure 12:
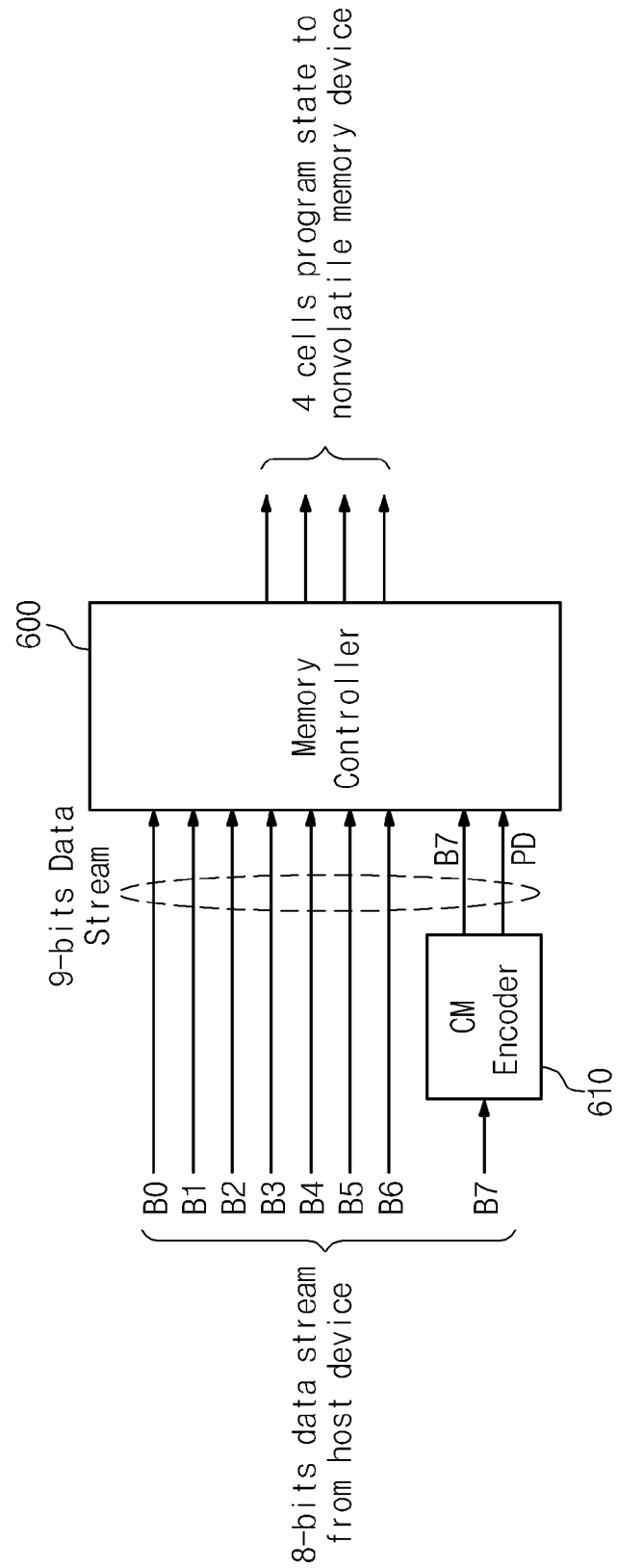
FIG. 12 is a block diagram illustrating a memory controller configured to perform a coded modulation scheme, according to embodiments of the inventive concept.

FIG. 12 is a block diagram illustrating a memory controller configured to perform a coded modulation scheme, according to embodiments of the inventive concept. Increased storage capacity of the memory cells of the lower word line group LWLG (or the upper word line group UWLG) may be used to store parity data for lowering bit error rates. In this case, the parity data may be added through a coded modulation scheme.

Referring to FIG. 12, for purposes of explanation, it may be assumed that the number of logic states of memory cells of the lower word line group LWLG (or the upper word line group LWLG) is five. That is, it is assumed that 2.25-bit data per memory cell is stored. In this case, since the number of data bits that can be stored per memory cell is not an integer, data are stored through the multi-dimensional modulation scheme discussed above. Also, assume that one-bit parity data PD is added to eight-bit data stream B0-B7 provided from a host device. However, the size of the parity data PD may change depending on an increased storage capacity of the memory cells of the lower word line group LWLG (or the upper word line group LWLG).

According to the coded modulation scheme, at least one-bit data of the data stream provided from the host device is provided to a coded modulation encoder 610. For instance, data bit B7 of the eight data bits B0-B7 provided from the host device may be provided to the coded modulation encoder 610.

As assumed above, to store 2.25-bit data per cell through the multi-dimensional modulation scheme, the coded modulation encoder 610 encodes the data bit B7 to generate one-bit parity data PD. The coded modulation encoder 610 outputs the data bit B7 and the generated parity data PD. The memory controller 600 receives the data bits B0-B6 from the host device, and receives the data bit B7 and the parity data PD from the coded modulation encoder 610. The memory controller 600 maps the provided nine data bits to be stored in one memory cell group comprised of four memory cells, as discussed above. That is, the memory controller 600 stores the nine data bits in one memory cell group comprised of four memory cells through the multi-dimensional modulation scheme.

In FIG. 12, the coded modulation encoder 610 is shown outside the memory controller 600. However, in various embodiments, the coded modulation encoder 610 may be included within the memory controller 600. Also, the memory controller 600 may further include a coded modulation decoder (not illustrated) configured to perform a coded modulation decoding operation.

According to the coded modulation scheme of various embodiments, reliability of data stored in memory cells of the lower word line group LWLG (or the upper word line group UWLG) may be improved.

Figure 13:
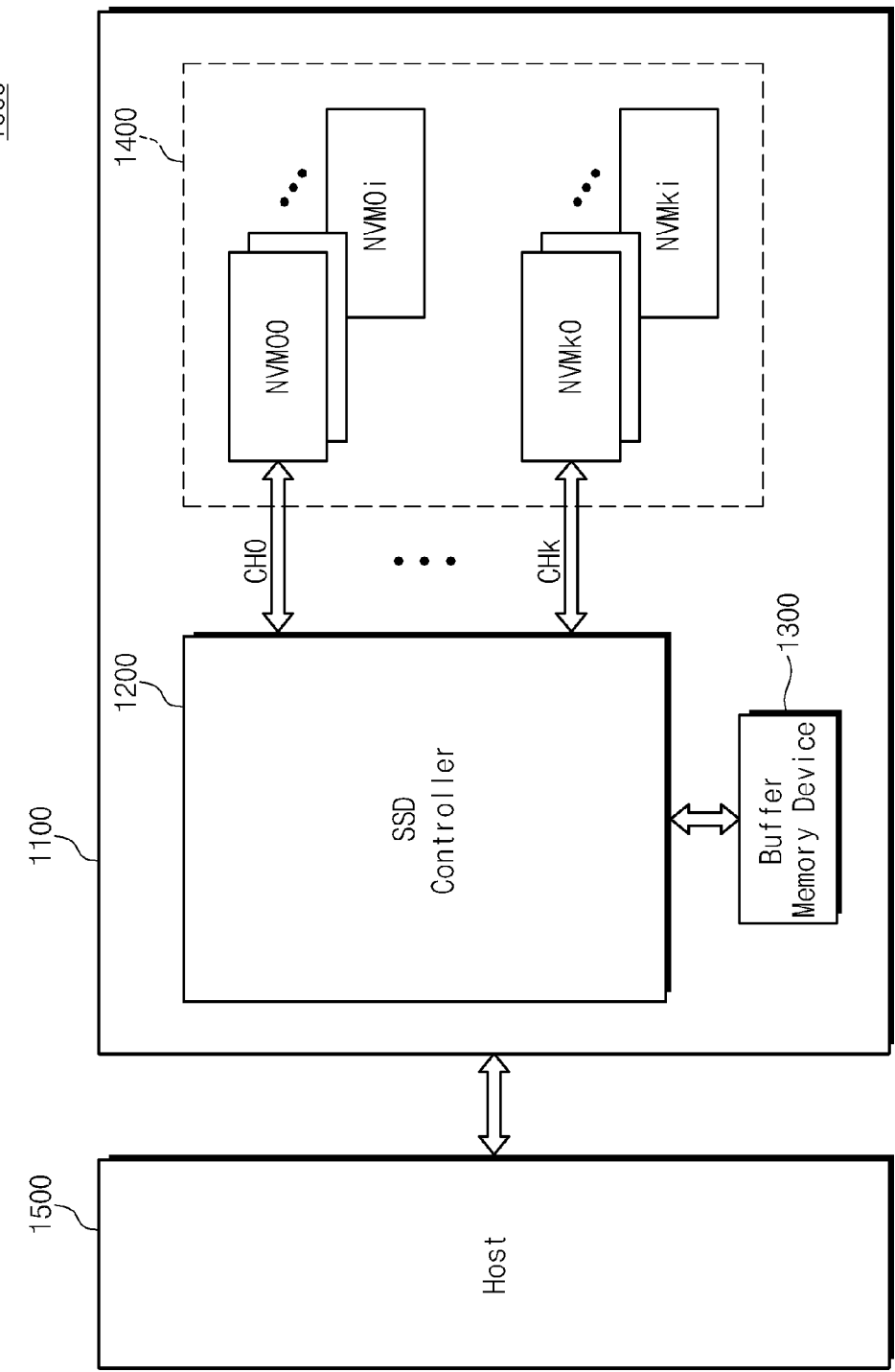
FIG. 13 is a block diagram illustrating a data processing system including a nonvolatile memory device, according to exemplary embodiments of the inventive concept.

FIG. 13 is a block diagram illustrating a data processing system including a nonvolatile memory device, according to embodiments of the inventive concept.

Referring to FIG. 13, the data processing system 1000 includes a data storage device 1100 and a host 1500. The data storage device 1100 may be a solid state drive SSD, for example. The SSD may include an SSD controller 1200, a buffer memory device 1300 and storage medium 1400. The SSD may further include a preliminary power supply circuit including super capacitors. The preliminary power supply circuit may supply power so that the SSD 1100 normally terminates when a sudden power off occurs.

The SSD 1100 operates in response to an access request from the host 1500. That is, the SSD controller 1200 accesses the storage medium 1400 in response to an access request of the host 1500. For instance, the SSD controller 1200 may be configured to control reading, writing and erasing operations of the storage medium 1400. The buffer memory device 1300 is configured to preliminarily store data to be stored in the storage medium 1400. Also, the buffer memory device 1300 is configured to preliminarily store data read from the storage medium 1400. Data stored in the buffer memory device 1300 is transferred to the storage medium 1400 or the host 1500 under control of the SSD controller 1200.

The SSD controller 1200 is connected to the storage medium 1400 through multiple channels CH0-CHk. Multiple nonvolatile memory devices NVM00-NVM0$i$~NVMk0-NVMki are connected to the respective channels CH0-CHk. The storage medium 1400 may include the nonvolatile memory device 100 of FIG. 1, for example, in accordance with various embodiments of the inventive concept. Thus, the SSD 1100 has improved data storage capacity.

Figure 14:
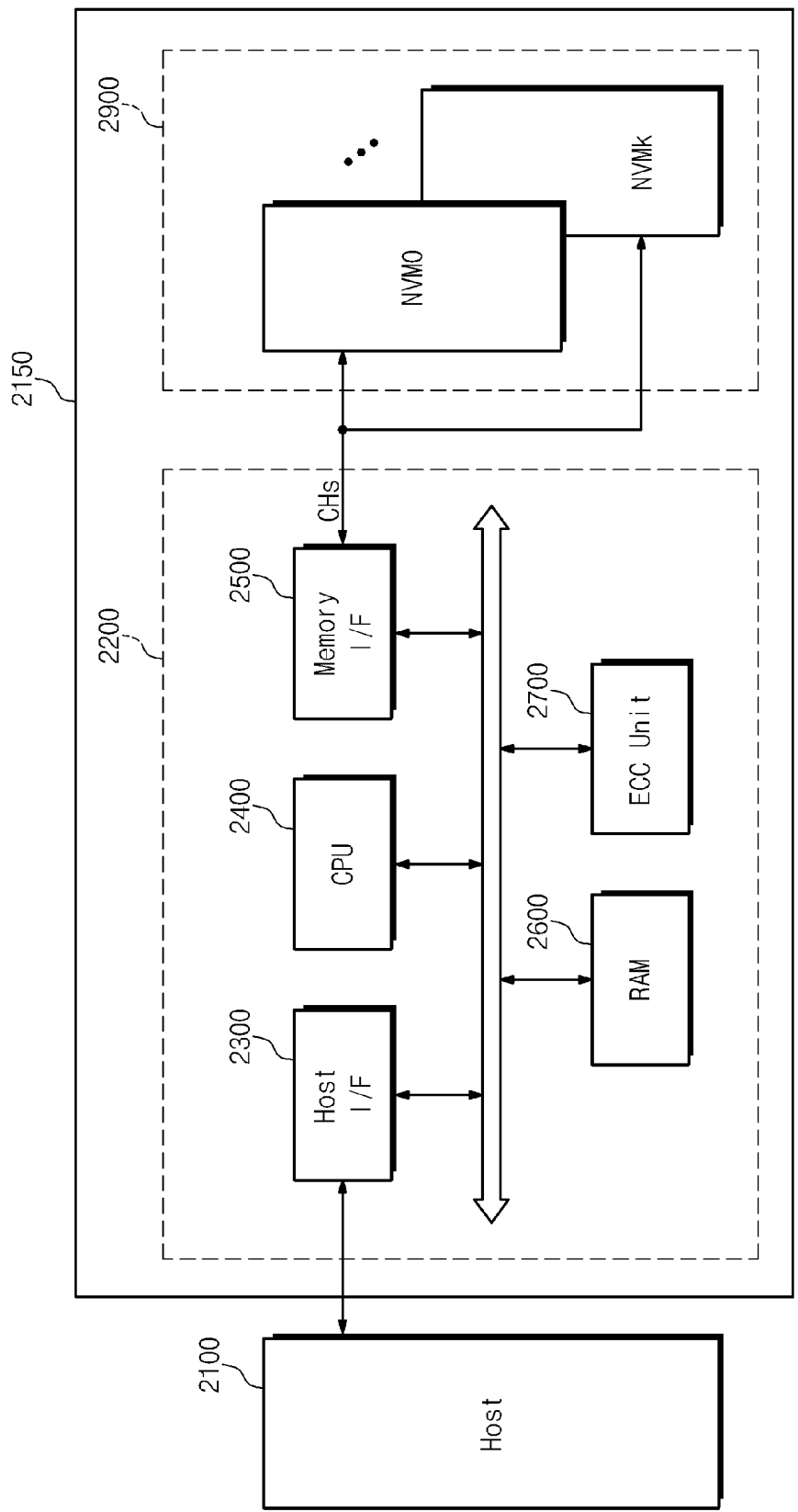
FIG. 14 is a block diagram illustrating another data processing system including a nonvolatile memory device, according to exemplary embodiments of the inventive concept.

FIG. 14 is a block diagram illustrating another data processing system including a nonvolatile memory device, according to embodiments of the inventive concept.

Referring to FIG. 14, data processing system 2000 includes a host 2100 and a data storage device 2150. The data storage device 2150 includes a controller 2200 and data storage medium 2900. In various embodiments, the data storage medium 2900 may include multiple data storage mediums.

The controller 2200 is connected to the host 2100 and the data storage medium 2900. Generally, the controller 2200 accesses the data storage medium 2900 in response to requests from the host 2100. For instance, the controller 2200 is configured to control reading, writing and erasing operations of the data storage medium 2900. That is, the controller 2200 provides an interface between the data storage medium 2900 and the host 2100. The controller 2200 may include software and/or firmware for controlling the data storage medium 2900.

In the depicted embodiment, the controller 2200 includes a host interface 2300, a central processing unit (CPU) 2400, a memory interface 2500, RAM 2600 and an error correction code unit (ECC) 2700. The RAM 2600 may be used as a working memory of the central processing unit 2400. The central processing unit 2400 controls the operation of the controller 2200.

The host interface 2300 may include a protocol for performing data exchange between the host 2100 and the controller 2200. For instance, the host interface 2300 may be configured to communicate with the host 2300 through one of various interface protocols such as a universal serial bus (USB) protocol, a multimedia card (MMC) protocol, a peripheral component interconnection (PCI) protocol, a PCI-express protocol, an advanced technology attachment (ATA) protocol, a serial ATA protocol, a small computer small interface (SCSI) protocol, an enhanced small disk interface (ESDI) protocol and an integrated drive electronics (IDE) protocol.

The error correction code unit 2700 is configured to detect and correct errors in data read from the data storage medium 2900. The memory interface 2500 interfaces the data storage medium 2900 and the controller 2200. The data storage medium 2900 may include the nonvolatile memory device 100 of FIG. 1, for example, according to various embodiments of the inventive concept. Thus, the data storage device 2150 has improved storage capacity and improved reliability.

The controller 2200 and the data storage medium 2900 may be integrated in one semiconductor device to constitute a memory card. For instance, the controller 2200 and the data storage medium 2900 may be integrated in one semiconductor device to constitute a personal computer memory card international association (PCMCIA) card, a compact flash (CF) card, a smart media card, a memory stick, a multi media card (MMC, RS-MMC, MMC-micro), a secure digital card (SD, mini-SD, micro-SD, SDHC), a universal flash storage (UFS) and so on.

The controller 2200 or the data storage medium 2900 can be mounted according to various types of packaging. For instance, the controller 2200 and/or the data storage medium 2900 can be mounted by various types of packaging, such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP), wafer-level processed stack package (WSP) and mounted.

Figure 15:
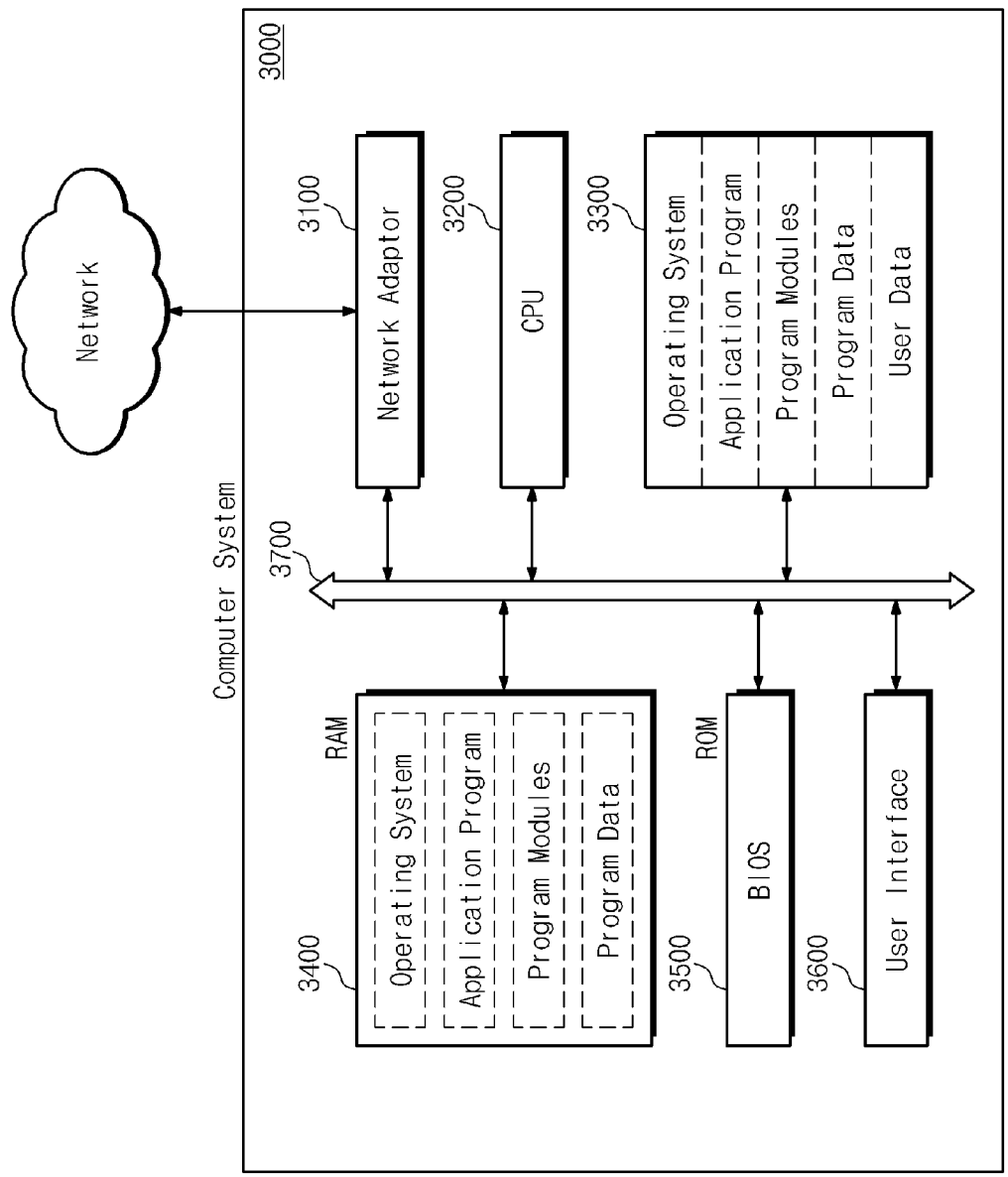
FIG. 15 is a block diagram illustrating a computer system fitted with a data processing system of FIG. 13, according to exemplary embodiments of the inventive concept.

FIG. 15 is a block diagram illustrating a computer system fitted with a data processing system of FIG. 13, according to embodiments of the inventive concept.

Referring to FIG. 15, computer system 3000 includes a network adapter 3100, a central processing unit 3200, a data storage device 3300, random access memory (RAM) 3400, read-only memory (ROM) 3500 and a user interface 3600 that are electrically connected to a system bus 3700. The data storage device 3300 may include the data storage device 1100 of the data processing system 1000 illustrated in FIG. 13, for example. The data storage device 3300 may also include the data storage device 2150 of the data processing system 2000 illustrated in FIG. 14, for example.

The network adapter 3100 provides an interface between the computer system 3000 and one or more external networks. The central processing unit 3200 performs the operation processes for driving an operating system or an application program permanently stored in the RAM 3400. The data storage device 3300 stores the data needed for operating the computer system 3000. For example, the data storage device 3300 may store an operating system for driving the computer system 3000, an application program, various program modules, program data and user data.

The RAM 3400 may be used as a working memory of the computer system 3000. When a booting operation is performed, the operating system, the application program and various program modules that are read from the data storage device 3300 and program data required when driving programs are loaded in the RAM 3400. The ROM 3500 stores a basic input/output system (BIOS), is activated before an operating system is driven when a booting operation is performed. Information exchange between the computer system 3000 and a user is performed through the user interface 3600.

In addition, the computer system 3000 may further include a battery and/or a modem. Although not illustrated in the drawing, the computer system 3000 may further include an application chipset, a camera image processor, a mobile DRAM or the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system comprising:
  at least one nonvolatile memory device in a plurality of memory blocks, wherein each memory block comprises a plurality of strings in a direction perpendicular to a substrate, wherein each string includes at least one string selection transistor, a plurality of memory cells arranged in a plurality of word lines and a plurality of bit lines and at least one ground selection transistor in series; and
  a memory controller configured to control the at least one nonvolatile memory device for storing n bit data per cell in first memory cells connected to a first word line of the plurality of word lines and m bit data per cell in second memory cells connected to a second word line of the plurality of word lines, wherein:
  n is an integer greater than zero, m>n, and m is not an integer,
  at least one word line of the plurality of word lines is included in a first word line group and at least one other word line of the plurality of word lines is included in a second word line group, and the number of data bits stored in each of the memory cells of a first of the strings differs depending on: (a) the location of the word line group to which the memory cell is connected and (b) the bit error rate of the memory cell.

2. The memory system of claim 1, wherein the each string further comprises at least one dummy memory cell between the at least one string selection transistor and the plurality of memory cells or between the plurality of memory cells and the at least one ground selection transistor.

3. The memory system of claim 1, wherein n bit data is 2 bit data.

4. The memory system of claim 1, wherein the plurality of word lines are stacked on the substrate, wherein the first word line is disposed on an upper portion of the second word line.

5. The memory system of claim 1, wherein the plurality of word lines are stacked on the substrate, wherein the first word line is disposed on a lower portion of the second word line.

6. The memory system of claim 1, wherein the memory controller encodes multi-bit data to be stored in a memory cell group comprised of memory cells connected to a word line of the plurality of word lines in a program operation, and outputs the multi-bit data to the at least one nonvolatile memory device.

7. The memory system of claim 6, wherein the multi-bit data include at least one parity bit data for lowering bit error rates.

8. The memory system of claim 7, wherein the memory controller further comprises, a coded modulation encoder configured to input the multi-bit data and to generate mapped data in the program operation; and a coded modulation decoder configured to decode the mapped data read from the at least one nonvolatile memory device in a read operation.

9. The memory system of claim 8, wherein the mapped data include at least one parity bit data for lowering bit error rates, wherein the coded modulation encoder generates the at least one parity bit data in the program operation.

10. The memory system of claim 1, wherein the memory system is a solid state drive.

11. The memory system of claim 1, wherein the each string is formed by a pillar penetrating insulating materials to contact the substrate, wherein the pillar is formed of at least one material and includes a channel layer and internal material formed within the channel layer.

12. The memory system of claim 11, wherein a width of a lower portion of the pillar is smaller than of a width of a upper portion of the pillar.

13. A nonvolatile memory device comprising:

a memory cell array including a plurality of memory blocks, wherein each memory block comprises a plurality of strings in a direction perpendicular to a substrate, wherein each string includes at least one string selection transistor, a plurality of memory cells arranged in a plurality of word lines and a plurality of bit lines and at least one ground selection transistor in series;

an address decoder configured to select a memory block among the plurality of memory blocks corresponding to a row address;

a reading and writing circuit configured to write data received from an external device in a page of the selected memory block in a program operation, and to read data from the page of the selected memory block through the plurality of bit lines in a read operation, wherein the page includes memory cells connected to a selected word line among the plurality of word lines; and a control logic configured to control the address decoder and the reading and writing circuit in the program operation or the read operation, wherein the each string is formed by a pillar penetrating insulating materials to contact the substrate, wherein the pillar is formed of at least one material and includes a channel layer and internal material formed within the channel layer, wherein at least one word line of the plurality of word lines is included in a first word line group and at least one other word line of the plurality of word lines is included in a second word line group, wherein n bit data are stored in first memory cells connected to the at least one word line included in the first word line group, wherein m bit data are stored in second memory cells connected to the at least one other word line included in the second word line group, and wherein n is an integer greater than zero, m>n, and m is not an integer, and wherein the number of data bits stored in each of the memory cells of a first of the strings differs depending on: (a) the location of the word line group to which the memory cell is connected and (b) the bit error rate of the memory cell.

14. The nonvolatile memory device of claim 13, wherein the first word line group is disposed above the second word line group.

15. The nonvolatile memory device of claim 13, wherein the second word line group is disposed above the first word line group.

16. The nonvolatile memory device of claim 13, wherein the first memory cells are single level cells and the second memory cells are multi-level cells.

17. The nonvolatile memory device of claim 13, wherein at least one of the first memory cells and the second memory cells stores mapped data per a memory cell group comprised of memory cells, wherein the mapped data is generated by encoding multi-bit data through multi-dimensional modulation scheme.

18. A method for operating a memory system including at least one nonvolatile memory device in a plurality of memory blocks, wherein each memory block comprises a plurality of strings in a direction perpendicular to a substrate, wherein each string includes at least one string selection transistor, a plurality of memory cells arranged in a plurality of word lines and a plurality of bit lines and at least one ground selection transistor in series and a memory controller configured to control the at least one nonvolatile memory device, the method comprising:

encoding first input data for storing n bit data per cell in a first memory cell group comprised of memory cells connected to a first word line of the plurality of word lines; and encoding second input data for storing m bit data per cell in a second memory cell group comprised of memory cells connected to a second word line of the plurality of word lines, wherein:

n is an integer greater than zero, m>n, and m is not an integer, at least one word line of the plurality of word lines is included in a first word line group and at least one other word line of the plurality of word lines is included in a second word line group, and the number of data bits stored in each of the memory cells of a first of the strings differs depending on: (a) the location of the word line group to which the memory cell is connected and (b) the bit error rate of the memory cell.

19. The method of claim 18, wherein the first and the second input data include at least one parity bit data for lowering bit error rates, further comprising the least one parity bit data.

20. The method of claim 18, further comprising,
decoding the encoded first input data read from the first memory cell group; and
decoding the encoded second input data read from the second memory cell group.

* * * * *